United States Patent [19]

Yamazaki

[11] Patent Number: 4,472,788
[45] Date of Patent: Sep. 18, 1984

[54] SHIFT CIRCUIT HAVING A PLURALITY OF CASCADE-CONNECTED DATA SELECTORS

[75] Inventor: Isamu Yamazaki, Kawasaki, Japan

[73] Assignee: Tokyo Shibaura Denki Kabushiki Kaisha, Kawasaki, Japan

[21] Appl. No.: 296,859

[22] Filed: Aug. 27, 1981

[30] Foreign Application Priority Data

Sep. 9, 1980 [JP] Japan ................................. 55-124091

[51] Int. Cl.$^3$ .............................................. G06F 7/00
[52] U.S. Cl. ..................................... 364/900; 364/715
[58] Field of Search ........................ 364/900, 200, 715

[56] References Cited

U.S. PATENT DOCUMENTS

| | | | |
|---|---|---|---|
| 3,810,115 | 5/1974 | Stafford | 364/900 |
| 3,961,750 | 6/1976 | Dao | 364/900 |
| 4,122,534 | 10/1978 | Casaratto | 364/900 |
| 4,345,316 | 8/1982 | Hirotani et al. | 364/900 |

OTHER PUBLICATIONS

Weinberger, "Arithmetic Shift" *IBM Tech. Disclosure Bulletin* vol. 19, No. 1, Jun. 1976 pp. 207-216.
Gersbach "High-Speed Shifter Array" *IBM Tech. Disclosure Bulletin* vol. 21, No. 4, Sep. 1978 pp. 1379-1380.
Houghtalen "Microprocessor with External Shift Capability" *IBM Tech. Disc. Bulletin* vol. 22, No. 7 Dec. 1979 p. 2714.
Gersbach "Algebraic/Logical Shift Matrix" *IBM Tech. Disc. Bulletin* vol. 23, No. 1, Jun. 1980 pp. 120-122.

*Primary Examiner*—David H. Malzahn
*Attorney, Agent, or Firm*—Oblon, Fisher, Spivak, McClelland & Maier

[57] ABSTRACT

A shift circuit comprises a plurality of stages of data selectors, a first data selector, a second data selector and a temporary register. The data selectors shift an n-bit input data by m bits which are specified by a shifting amount data and produces a first output data or a second output data. The first and second data selectors selectively output the first and second output data in accordance with shift direction. The temporary register comprises n bits for storing a data which is not selected by said first or second data selector.

6 Claims, 5 Drawing Figures

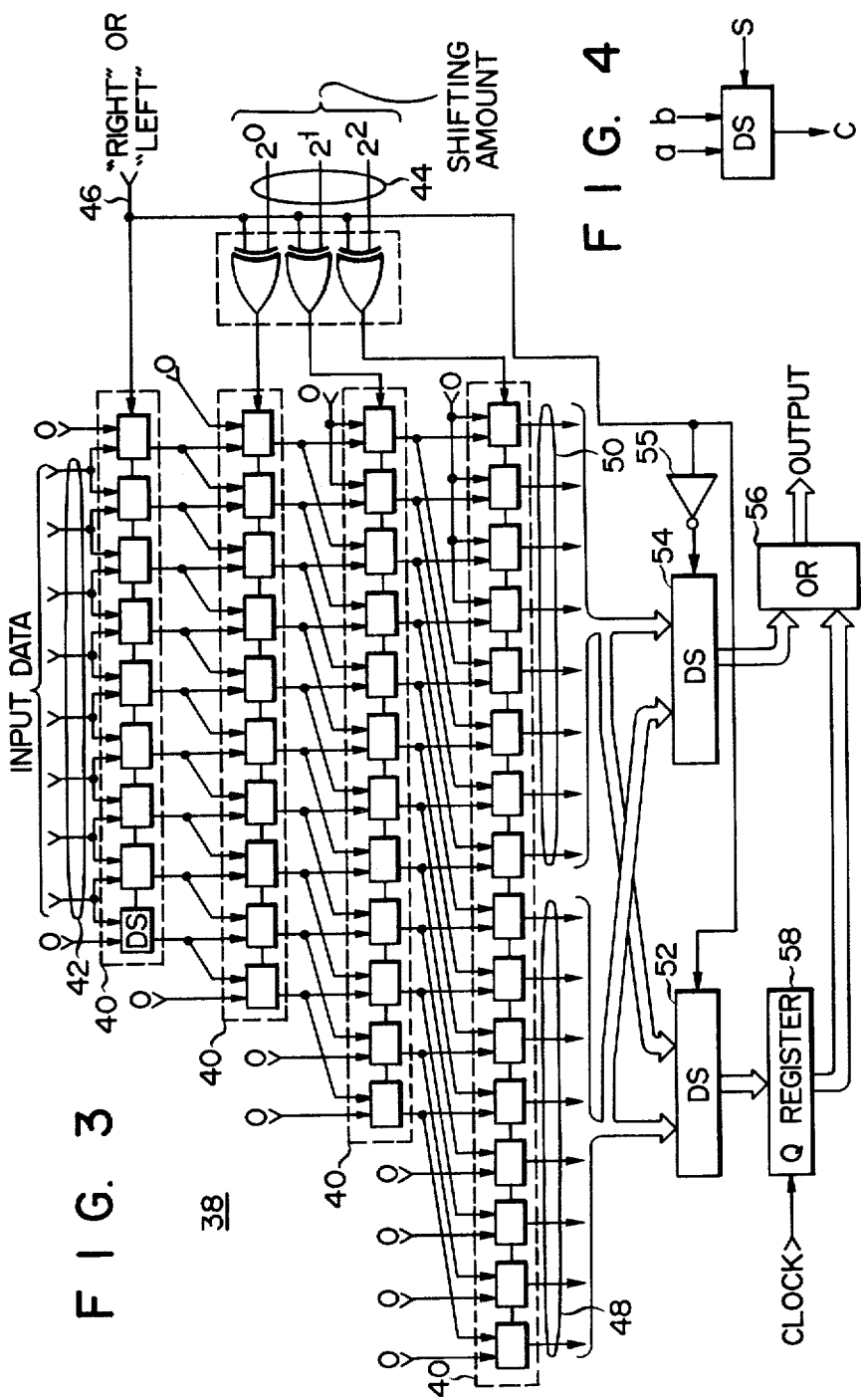

4,472,788

SHIFT CIRCUIT HAVING A PLURALITY OF CASCADE-CONNECTED DATA SELECTORS

BACKGROUND OF THE INVENTION

This invention relates to an improved shift circuit which shifts data at a high speed.

FIG. 1 is a schematic block circuit diagram of a central processing unit 2 (hereinafter called "CPU 2"). The CPU 2 is a single chip circuit comprising temporary registers (A, T, B, M) 4, an arithmetic logic circuit 8, a shifter 10, a microprogram ROM 12, a branch control unit 14, a status control unit 16, a common bus buffer/receiver 18, a timing generator & bus controller 22, and a special function unit 26.

The temporary registers 4 store data supplied through an internal bus 6. The arithmetic logic unit 8 carries out arithmetic logic operations such as addition, subtraction, AND, OR with respect to data set from the temporary registers 4. The shifter 10 is designed to shift the data sent from the temporary registers 4. The microprogram ROM 12 stores information showing the sequence in which data are processed by the CPU 2. The branch control unit 14 controls the branching of a microprogram. The status control unit 16 includes flip-flop registers for storing the current status of the CPU 2 and a circuit for controlling the status of the flip-flop registers. The common bus buffer/receiver 18 receives and supplies data through an external bus. The timing generator & bus controller 22 controls transmission of data between the CPU 2 and a memory means or an input-output device and produces clock signals for defining the timing in which data are stored into the temporary registers 4 and general registers. The special function unit 26 is used to, for example, expand a bit arrangement.

The shifter 10 is a conventional shift register. It shifts a 1-bit data at one cycle. Thus, to shift an m-bit data it would take m-cycle time. To shorten the time necessary for shifting data a new type of computer has been developed which has a shifter for shifting data at a high speed. Such a shifter is shown in FIG. 2.

FIG. 2 is a block circuit diagram of a shifter consisting of a plurality of data selectors (DS) which are cascade-connected. The shifter receives an n-bit input data (n=8) and shifts the data by m-bit positions (m<n) at one cycle. To the shifter an 8-bit data is supplied through input lines 28, a 3-bit data specifying an amount of shifting (i.e. m) is supplied through first control lines 30, and a 1-bit data specifying a "right" or "left" shift is supplied through a second control line 32. Both the 3-bit data and the 1-bit data are supplied to the data selectors DS. If the 1-bit data specifies "right" shift, the 8-bit data is shifted to the right by m bits and is obtained through output lines 34 at one cycle. If the 1-bit specifies "left" shift, the 8-bit data is shifted to the left by m bits and is obtained through output lines 36 at one cycle.

With the shifter shown in FIG. 2, however, several steps must be carried out, as will be described below, in order to shift a multi-length data (2n bits, 3n bits, . . . ) by m bits either to the right or to the left.

EXAMPLE 1

To shift a 2n-bit data to the right by m bits (m<n), said 2n-bit data consisting of an n-bit data A and an n-bit data B, the data A and B are stored respectively into a register A and a register B, and another register T is used. More specifically, the following steps are carried out.

1. The contents of the register B are shifted to the right by m bits by the shifter, and the result is stored into the register B. The leftmost m bits of the register B are therefore all 0s.
2. (n−m) is assumed to be l.
3. The contents of the register A are shifted to the left by l bits by the shifter and are stored into the register T.
4. A logical OR operation is performed with the contents of the registers T and B, and the result of the operation is stored into the register B.
5. The contents of the register A are then shifted to the right by m bits and are stored into the register A. The data shifting is thus completed.

That is, the above-mentioned five steps must be carried out to shift a 2n-bit data to the right by m bits. In other words, it takes a 5-cycle time to shift the data, by shifting an n-bit data at one cycle.

EXAMPLE 2

To shift an 2n-bit data to the right by m bits (0≦m<2n), said 2n-bit data consisting of an n-bit data A and an n-bit data B are stored respectively into a register A and a register B, and another register T is used. More specifically, the following steps are carried out.

| | |
|---|---|
| 1. | If m < n, the control goes to step 2. If m ≧ n, the control goes to step 7. |
| 2. | |
| 3. | |
| 4. | Same as steps 1 to 5 of Example 1 |
| 5. | |
| 6. | |
| 7. | (m − n) is assumed to be k. |
| 8. | The data A is shifted to the right by k bits and is stored into the register B. |
| 9. | The register A is filled with "0". The data shifting thus completes. |

EXAMPLE 3

To achieve rotate shifting of an 2n-bit data to the right by m bits (0≦m<2n), said 2n-bit data consisting of an n-bit data A and an n-bit data B, the data A and B are stored respectively into a register A and a register B, and other registers T and M are used. More specifically, the following steps are carried out.

1. If m<n, the control goes to step 6. If m≧n, the control goes to step 2.
2. It is assumed that (m−n) is new m.
3. The contents of the register B are loaded into the register C.
4. The contents of the register A are loaded into the register B.
5. The contents of the register C are loaded into the register A, thus achieving data swapping between the registers A and B.
6. It is assumed that (n−m)=l.
7. The contents of the register B are shifted to the left by l bits and are loaded into the register M.
8. The contents of the register B are shifted to the right by m bits and are loaded into the register B.
9. The contents of the register A are shifted to the left by l bits and are loaded into the register T.
10. The contents of the registers B and T are ORed and the result is loaded into the register B.

11. The contents of the register A are shifted to the right by m bits and are loaded into the register A.
12. The contents of the registers M and A are ORed and the result is loaded into the register A. The data shifting thus completes.

Hence, there is almost no merit of using the shifter of such structure as illustrated in FIG. 2.

SUMMARY OF THE INVENTION

It is an object of this invention to provide a shift circuit which can shift a multi-length data at a high speed.

To achieve the object of the invention, in a shift circuit having a plurality of stages of data selectors to which are supplied input data, a shifting amount data and a shifting direction data, the improvement comprises shifting means for shifting an n-bit input data by m bits (m<n) specified by the shifting amount data for producing a first output data or a second output data, where n and m are integers; data selector means for selectively outputting the first or second output data in accordance with the shift direction data; and temporary register means comprised of n bits for storing data which are not selected by said data selector means.

BRIEF DESCRIPTION OF THE DRAWINGS

Other objects and features of the present invention will be apparent from the following description, when taken in connection with the accompanying drawings.

FIG. 3 is a circuit diagram of a shift circuit, and embodiment of the present invention;

FIG. 4 shows a data selector used in the shift circuit shown in FIG. 3; and

DETAILED DESCRIPTION OF THE PREFERRED EMBODIMENTS

Figure 1:
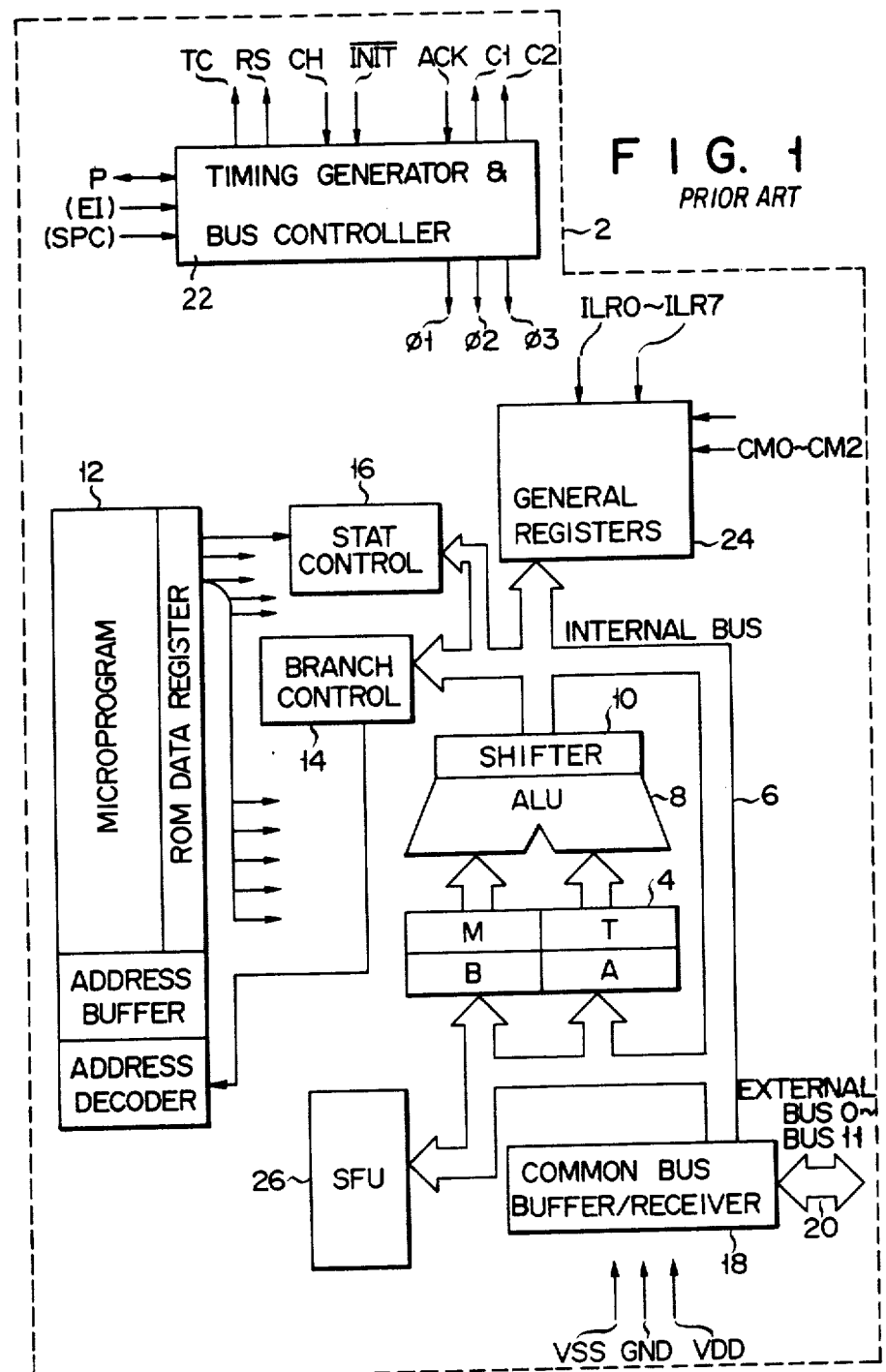
FIG. 1 is a schematic block circuit diagram of a conventional central processing unit including a shifter.

As shown in FIG. 3, a shift circuit 38 of the present invention has a plurality of data selectors 40 (hereinafter called "DSs") which are cascade-connected in four stages. An 8-bit data to be shifted is fed through a control line 42 to the DSs of the first stage. Shifting amount data, a binary data representing m bits by which to shift the input data, is fed through a control line 44 to the DSs of the second, third and fourth stages. Shift direction data is fed through a control line 46 to the DSs of the first stage. When the shift direction data is logical "1", the input data is shifted to the left. When the shift direction data is logical "0", the input data is shifted to the right.

The shift circuit 38 further has 2n data output lines. These output lines are divided into two groups each consisting of n output lines. When the "right" operation is designated, the data output lines 48 of the first group are selected so that through them the input data may be outputted after it has been shifted to the right by m bits. When the "left" operation is designated, the data output lines 50 of the second group are selected so that through them the input data may be outputted after it has been shifted to the left by m bits.

As shown in FIG. 4, each DS 40 receives data a and b both to be shifted. It also receives a select signal S and produces an output signal C. When the select signal S is logical "1", the DS 40 selects data a. When the select signal S is logical "0", it selects data b.

As illustrated in FIG. 3, the shift circuit has two data selectors 52 and 54. The data selector 52 is coupled to the output lines 48 of the first group and also to the output lines 50 of the second group. Similarly, the data selector 54 is coupled to the output lines 48 of the first group and also to the output lines 50 of the second group. Hence, the data selectors 52 and 54 can select data which are supplied either through the output lines 48 or the output lines 50. The DSs 52 and 54 are complementary and function in accordance with the input and output of an inverter 55. That is, when the DS 54 selects the output lines 48, the DS 52 selects the output lines 50. Conversely, when the DS 54 selects the output lines 50, the DS 52 selects the output lines 48. The output of the DS 52 is supplied to a Q register, and the output of the DS 54 is coupled to one input terminal of an OR gate 56.

The Q register 58 holds the output from the DS 52 in response to a clock corresponding to one cycle of the shift circuit 38. The output of the Q register 58 is fed to the other input terminal of the OR gate 56. The Q register 58 can be cleared by a mechanism (not shown). As long as the Q register 58 remains clear, the input data is shifted by m bits (m<8) and supplied through the output of the OR gate 56.

Figure 2:
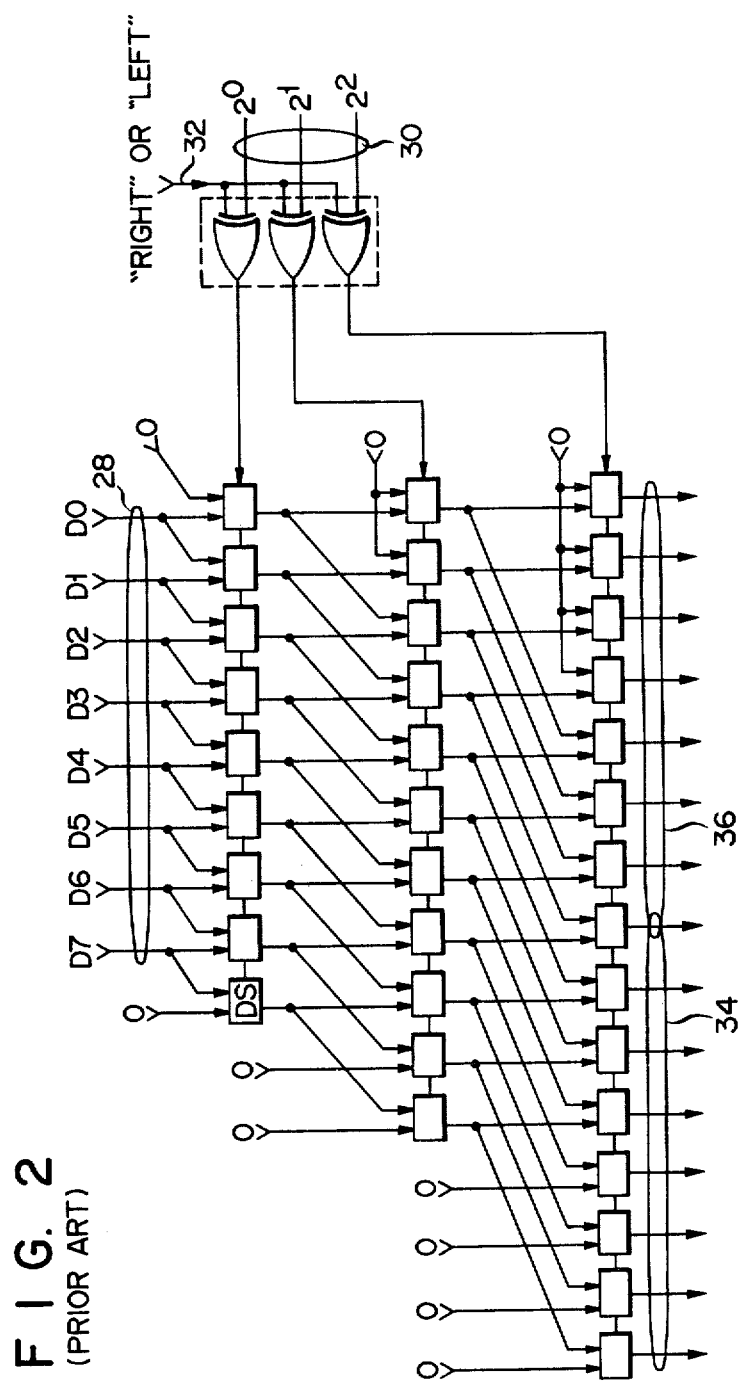
FIG. 2 is a block diagram of a conventional shifter.

The shift circuit of FIG. 3 shifts n-bit data exactly in the same way and thus achieves exactly the same effects as does the shift circuit of FIG. 2. That is, it provides an m-bit shifted data (m<n) at one cycle. Unlike the circuit of FIG. 2, the shift circuit of FIG. 3 can shift a double length data at a higher speed, using the Q register 58.

More specifically, with the shift register of FIG. 3 only two steps are carried out to shift a 2n-bit data to the right by m bits (m<n), said data consisting of an n-bit data A and an n-bit data B just as in Example 1. The two steps are as follows:

1. The contents of a register A are shifted to the right by m bits by the shift circuit 38, and the result is stored into the register A.
2. The contents of a register B are shifted to the right by m bits by the shift circuit, and the result is stored into the register B. Here, the Q register is assumed to have been cleared before the execution of step 1.

In step 1, the data A is fed through the input lines 42 from the register A (e.g. one of such general registers 24 as shown in FIG. 1). The shifting amount data is fed through the control lines 44, and the logic "0" data is fed through the control line 46. Accordingly, the DS 54 selects the output lines 48 of the first group, whereby the input data shifted to the right by m bits is supplied to the OR gate 56. Since. the Q register 58 has been cleared, the output of the OR gate 56, i.e. the shifted data A, is stored back into the register A. At the same time, the DS 52 selects the output lines 50 of the second group so that the data A shifted to the left by (n−m) bits is stored into the Q register 58 after the execution of step 1.

In step 2, the data B is fed through the input lines 42 from the register B (e.g. one of the general registers 24). The shifting amount data is fed through the control line 44, and the logical "0" data is fed through the control line 46. The DS 54 therefore selects the output lines 48 of the first group. The data A shifted to the left by (n−m) bits (thus, the right most m bits being of logic "0") is thus supplied to one input terminal of the OR gate 56 from the Q register 58. Simultaneously, to the other input terminal of the OR gate 56 there is supplied a data B shifted to the right by m bits (thus, the left most (n−m) bits being of logic "0").

Thus, the OR gate 56 outputs a data of which (n−m) bits are the data obtained by shifting the data B to the right by m bits and of which m bits are the data obtained by shifting the data B to the right by m bits. The output of the OR gate 56 is stored into the register B, and thus completes the shifting of the double-length input data.

Figure 5:
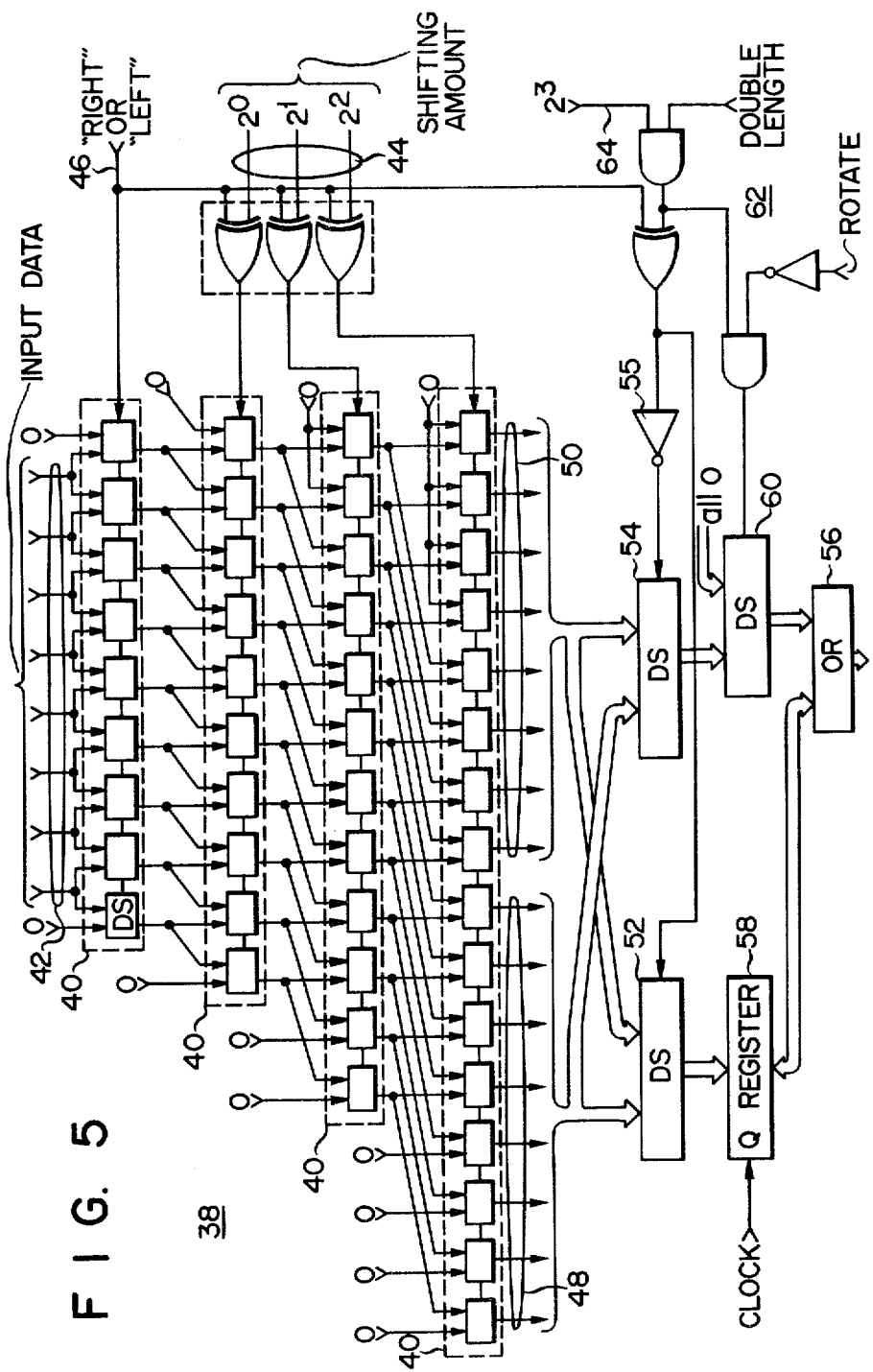
FIG. 5 is a circuit diagram of another shift circuit according to the present invention.

FIG. 5 shows another embodiment of the invention. In FIG. 5, like reference numerals are used to denote the elements which are similar to those shown in FIG. 3. And the similar elements are not described here in detail. Unlike the circuit of FIG. 3, the shift circuit of FIG. 5 has a data selector 60 (hereinafter called "DS 60") and a double-length designation/rotation designation circuit 62. The DS 60 selects either the output of a DS 54 or an n-bit data of which all bits are of logical "0". The shift circuit of FIG. 5 further has a control line for supplying a shifting amount data representing m bits ($n \leq m < 2n$) by which to shift an input data.

With the shift circuit of FIG. 5 only two steps are carried out to shift a 2n-bit data to the right (or the left) by m bits ($0 \leq m < 2n$), said data consisting of an n-bit data A and an n-bit data B. The two steps are as follows:
1. The data A is shifted to the right (or the left) by m bits, and the result is stored into a register A.
2. The data B is shifted to the right (or the left) by m bits, and the result is stored into a register B.

With the shift circuit of FIG. 5 only three steps are carried out to rotate-shift a 2n-bit data to the right (or the left) by m bits ($0 \leq m < 2n$), said data consisting of an n-bit data A and an n-bit data B. The three steps are as follows:
1. The data A is rotate-shifted to the right (or the left) by m bits, and the result is stored into the register A.
2. The data B is rotate-shifted to the right (or the left) by m bits, and the result is stored into the Q register.
3. The contents of the register A are ORed with the contents of the Q register, and the result is stored into the register A.

According to the present invention a small number of steps suffice to shift a double-length data and to rotate-shift a double-length data. Further, either data shifting operation can be effected at a higher speed than by the prior art shift circuit. If the shifting amount is smaller than the number of bits constituting the input data (that is, if $m < n$), a K times length data can be shifted by repeating steps 1 and 2 K times. Moreover, as mentioned above, a small number of steps suffice to rotate-shift a single-length data.

Although only two exemplary embodiments have been described above in detail, those skilled in the art will readily appreciate that many other embodiments are possible without materially departing from the novelty teachings and advantages of this invention.

For example, instead of the data selectors which are cascade-connected are used as a shift circuit in the above-mentioned embodiments, use may be made of a shifter of a matrix type or other types. In the embodiments of FIGS. 3 and 5 the data selector stage is provided in an input stage. Instead, the data selector stage may be provided in the output stage, thus achieving the same effect as in the embodiments of FIGS. 4 and 5.

Accordingly, all such modifications are intended to be included within the scope of this invention as defined in the following claims.

What is claimed is:

1. In a shift circuit to which an input data, a shifting amount data and a shift direction data are applied, the improvement comprising:
   shifting means for shifting an n-bit input data by m bits specified by the shifting amount data for producing a first n-bit shifted data and a second n-bit shifted data, where n and m are integers;
   data selector means for selectively receiving and arranging said first and second shifted data in order to output a signal having a first and second portion in accordance with the shift direction data;
   temporary register means comprised of n-bits connected to receive and store said first portion of the output signal of said data selector means; and
   output means coupled to said data selector means and said temporary register means to output the logical sum between said second portion of the output signal of said data selector means and the contents of said temporary register means.

2. A shift circuit according to claim 1, wherein said shifting means comprises a plurality of stages of data selectors.

3. A shift circuit according to claim 2, wherein said data selector means comprises a first data selector, a second data selector and a third data selector, said third data selector being coupled between said output means and one of said first and second data selector for receiving the output data from said one of said first and second data wherein all bits are of logical "0" and for selecting one of these data.

4. A shift circuit according to claim 1, wherein said data selector means comprises a first data selector and a second data selector and said temporary register means is coupled to said first data selector.

5. A shift circuit according to claim 4, further comprising inverting means coupled to said second data selector for inverting the direction of data shifting so that said first and second data selectors operate in such manner that one of them selects a data, whereas the other of them selects a data not selected by said one data selector.

6. A shift circuit according to any one of claims 1-5, further comprising means for designating a double-length shift operation and a rotate shift operation.

* * * * *